United States Patent
Noda et al.

(10) Patent No.: US 9,094,134 B2
(45) Date of Patent: Jul. 28, 2015

(54) OPTICAL RECEIVER

(75) Inventors: Masaki Noda, Tokyo (JP); Masamichi Nogami, Tokyo (JP); Junichi Nakagawa, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 171 days.

(21) Appl. No.: 14/003,139

(22) PCT Filed: Apr. 5, 2011

(86) PCT No.: PCT/JP2011/058592
§ 371 (c)(1),
(2), (4) Date: Sep. 4, 2013

(87) PCT Pub. No.: WO2012/137299
PCT Pub. Date: Oct. 11, 2012

(65) Prior Publication Data
US 2013/0343769 A1 Dec. 26, 2013

(51) Int. Cl.
*H04B 10/69* (2013.01)
*H03G 3/30* (2006.01)

(52) U.S. Cl.
CPC ......... *H04B 10/6931* (2013.01); *H03G 3/3084* (2013.01); *H04B 10/693* (2013.01)

(58) Field of Classification Search
CPC ............ H04B 10/693–10/6931; H03G 3/3084
USPC .......................................................... 375/345
See application file for complete search history.

(56) References Cited

U.S. PATENT DOCUMENTS

| 5,539,779 A * | 7/1996 | Nagahori ..................... 375/317 |
| 2007/0098416 A1 | 5/2007 | Nogami et al. |
| 2008/0031638 A1 | 2/2008 | Nakamoto et al. |
| 2009/0252504 A1 | 10/2009 | Noda et al. |
| 2010/0067924 A1 | 3/2010 | Noda et al. |
| 2010/0272448 A1 | 10/2010 | Kubo |
| 2011/0291766 A1 * | 12/2011 | Mashimo et al. ............. 330/308 |

FOREIGN PATENT DOCUMENTS

| CN | 101563843 A | 10/2009 |
| EP | 2 096 754 A1 | 9/2009 |
| JP | 2003 209485 | 7/2003 |
| JP | 2008 312216 | 12/2008 |

(Continued)

OTHER PUBLICATIONS

Extended European Search Report issued on Aug. 27, 2014 in the corresponding European Application No. 11863096.1.
Combined Chinese Office Action and Search Report issued Jun. 4, 2014 in Patent Application No. 201180057707.0 (with partial English language translation and English translation of categories of cited documents).

(Continued)

*Primary Examiner* — David Payne
*Assistant Examiner* — Casey Kretzer
(74) *Attorney, Agent, or Firm* — Oblon, McClelland, Maier & Neustadt, L.L.P.

(57) ABSTRACT

An optical receiver including: a preamplifier capable of changing a conversion gain in accordance with a reception level of a received burst signal; a gain control circuit capable of switching between a fast time constant and a slow time constant; and a convergence determination circuit for outputting a time constant switching signal in accordance with a state of the gain control circuit (transient state or steady state) and a reset signal between the burst signals. This configuration can switch the time constant of the gain control circuit at an appropriate timing.

6 Claims, 3 Drawing Sheets

(56) References Cited

FOREIGN PATENT DOCUMENTS

| WO | 2007 102189 | 9/2007 |
| WO | 2008 075430 | 6/2008 |
| WO | 2009 066690 | 5/2009 |

OTHER PUBLICATIONS

International Search Report Issued May 24, 2011 in PCT/JP11/58592 filed Apr. 5, 2011.
Japanese Office Action Issued Sep. 4, 2012 in JP2012-532798 Filed Jun. 7, 2010.

* cited by examiner

OPTICAL RECEIVER

TECHNICAL FIELD

The present invention relates to an optical receiver, and more particularly, to an optical receiver that is employed in a passive optical network (PON) system as one of access optical communication systems.

BACKGROUND ART

Conventionally, passive optical network (PON) systems have been widely employed as systems capable of realizing public networks using optical fibers. The PON system is one type of point-to-multipoint access optical communication systems.

The PON system is made up of one optical line terminal (OLT) and a plurality of optical network units (ONUs). The OLT is a station device and the ONUs are subscriber terminal devices. The OLT is connected to the respective ONUs via an optical star coupler. In the PON system, a large number of ONUs can share the OLT and most of the transmission lines (optical fibers). Lower operating cost can therefore be expected. Further, the optical star coupler is a passive component, which needs no power supply. The optical star coupler can therefore be installed outdoors easily. Further, the optical star coupler is high in reliability. Because of those reasons, the PON system has been actively introduced in recent years as a trump card for realizing a broadband network.

A gigabit Ethernet-passive optical network (GE-PON) system is now described as an example. In the GE-PON, the transmission rate is 1.25 Gbit/s as defined by the IEEE 802.3ah standard. The downlink from the OLT to the ONUs employs broadcast communications using a signal with an optical wavelength from 1,480 nm to 1,500 nm, and each of the ONUs extracts only data in an allocated time slot. The uplink from the ONUs to the OLT, on the other hand, employs broadcast communications using a signal with an optical wavelength from 1,260 nm to 1,360 nm, and time division multiplex communications in which transmission timings of data from the ONUs are controlled so as to prevent the collision of data.

Subsequently, 10G-EPON is described. In the 10G-EPON, the transmission rate is 10.3 Gbit/s as defined by the IEEE802.3av standard. In the 10G-EPON system, the downlink from the OLT to the ONUs employs broadcast communications using a signal with an optical wavelength from 1,574 nm to 1,580 nm, and each of the ONUs extracts only data in an allocated time slot. The uplink from the ONUs to the OLT, on the other hand, employs time division multiplex communications in which a signal with an optical wavelength from 1,260 nm to 1,280 nm is used and transmission timings of data from the ONUs are controlled so as to prevent the collision of data.

In the uplink communication of the above-mentioned PON system, the ONUs are positioned at different distances from the optical star coupler. The OLT therefore has different reception levels (received light levels) of the ONUs depending on received packets. Consequently, an OLT burst optical receiver needs to have wide dynamic range characteristics. The wide dynamic range characteristics as used herein are characteristics for reproducing burst signals having different reception levels stably at high speed. In general, the OLT burst optical receiver therefore includes an automatic gain control (AGC) circuit. The AGC circuit is a circuit for changing the conversion gain to a desired gain in accordance with the reception level.

The above-mentioned AGC circuit has a time constant required for the conversion gain to stably converge after the reception of a burst signal. Specifically, a predetermined time is necessary for the OLT burst optical receiver to reproduce data stably after receiving a burst signal. The predetermined time is standardized as a receiver settling time by IEEE802.3ah and IEEE802.3av. The standardized value of the receiver settling time is 400 ns under IEEE802.3ah (GE-PON system) and 800 ns under IEEE802.3av (10G-EPON system).

Each burst signal includes an overhead area and a data area. The overhead area has a length of the receiver settling time or larger. In order to improve the throughput of the overall system, however, the length of the overhead area is desired to be smaller. In this case, the AGC circuit operates based on a detection result of an average value of the received signals, and hence there is a trade-off relationship between the consecutive identical digit duration and the time constant. It is therefore a challenge to achieve both consecutive identical digit tolerance and high-speed response. Note that, the consecutive identical digit duration is the duration in which identical digits contained in a code string of the received signal are consecutive.

Various methods have been proposed for realizing an AGC circuit that has an excellent consecutive identical digit tolerance and responds at high speed. For example, in the methods described in Patent Literature 1 and Patent Literature 2, the AGC circuit is operated with a fast time constant only for the vicinity of the head of a received burst signal. After that, the AGC circuit is operated with a slow time constant.

CITATION LIST

Patent Literature

[PTL 1] WO 2008/075430 A1
[PTL 2] JP 2008-312216 A

SUMMARY OF INVENTION

Technical Problem

In Patent Literature 1, the time constant of the AGC circuit switches, in one burst signal, from the one for high-speed operation to the one for low-speed operation. It is therefore possible to achieve both the high-speed response in the overhead area and the consecutive identical digit tolerance in the data area. In Patent Literature 1, however, it is difficult to determine a convergence state in the case where a consecutive burst signal sequence has a small reception level difference. Consequently, there is a problem in that the time constant cannot be switched at a desired timing.

In Patent Literature 2, similarly to Patent Literature 1, the time constant of the AGC circuit is switched from the one for high-speed operation to the one for low-speed operation in one burst signal, and hence it is possible to achieve both the high-speed response in the overhead area and the consecutive identical digit tolerance in the data area. The timing of switching the time constant is, however, a fixed time with reference to a reset signal. Patent Literature 2 therefore has a problem in that the time constant cannot be switched at a desired timing in the case where a reception timing of the burst signal and a reception timing of the reset signal are relatively shifted as exemplified in the GE-PON system (asynchronous PON system) or the 10G-EPON system described above.

The present invention has been made for solving the problems described above, and it is an object thereof to provide an optical receiver that has wide dynamic range characteristics, high-speed response, and consecutive identical digit tolerance and realizes high throughput characteristics.

Solution to Problem

An optical receiver according to the present invention includes: a photodetector for converting a light reception signal into a current signal; a preamplifier for converting the current signal output from the photodetector into a voltage signal; gain control means for detecting an average voltage of the voltage signal output from the preamplifier and controlling, with use of the detected average voltage, a conversion gain of the preamplifier to be a desired gain suitable for a reception level of the light reception signal; convergence determination means for determining whether the gain control means is in a transient state or in a steady state; and switching signal output means for generating, in response to a reset signal inserted between the light reception signals, a time constant switching signal for switching a time constant of the gain control means based on any one of an output from the convergence determination means and the reset signal, in which the gain control means includes: a first average voltage detection section that has a first time constant, for detecting an average voltage of the voltage signal output from the preamplifier; a second average voltage detection section that has a second time constant longer than the first time constant, for detecting an average voltage of the voltage signal output from the preamplifier; and a switch section for switching between the first average voltage detection section and the second average voltage detection section based on the time constant switching signal, and in which the time constant switching signal is configured to: choose the first average voltage detection section when the reset signal is input; and choose the second average voltage detection section when the convergence determination circuit determines that the gain control circuit has shifted from the transient state to the steady state.

Advantageous Effects of the Invention

The optical receiver according to the present invention includes: the photodetector for converting a light reception signal into a current signal; the preamplifier for converting the current signal output from the photodetector into a voltage signal; the gain control means for detecting an average voltage of the voltage signal output from the preamplifier and controlling, with use of the detected average voltage, a conversion gain of the preamplifier to be a desired gain suitable for a reception level of the light reception signal; the convergence determination means for determining whether the gain control means is in a transient state or in a steady state; and the switching signal output means for generating, in response to the reset signal inserted between the light reception signals, the time constant switching signal for switching the time constant of the gain control means based on any one of the output from the convergence determination means and the reset signal, in which the gain control means includes: the first average voltage detection section that has the first time constant, for detecting an average voltage of the voltage signal output from the preamplifier; the second average voltage detection section that has the second time constant longer than the first time constant, for detecting an average voltage of the voltage signal output from the preamplifier; and the switch section for switching between the first average voltage detection section and the second average voltage detection section based on the time constant switching signal, and in which the time constant switching signal is configured to: choose the first average voltage detection section when the reset signal is input; and choose the second average voltage detection section when the convergence determination circuit determines that the gain control circuit has shifted from the transient state to the steady state. Thus, the optical receiver can have wide dynamic range characteristics, high-speed response, and consecutive identical digit tolerance and realize high throughput characteristics.

DESCRIPTION OF EMBODIMENTS

Referring now to the accompanying drawings, a detailed description is made of optical receivers according to embodiments of the present invention. Note that, the present invention is not limited to the embodiments. For example, a burst optical receiver is described in the embodiments as an example of the optical receiver, but the present invention is applicable also to other types of the optical receiver. Further, appropriate modifications can be made to the circuit configuration depending on the intended use, the usage environment, or the like.

First Embodiment

Figure 1:
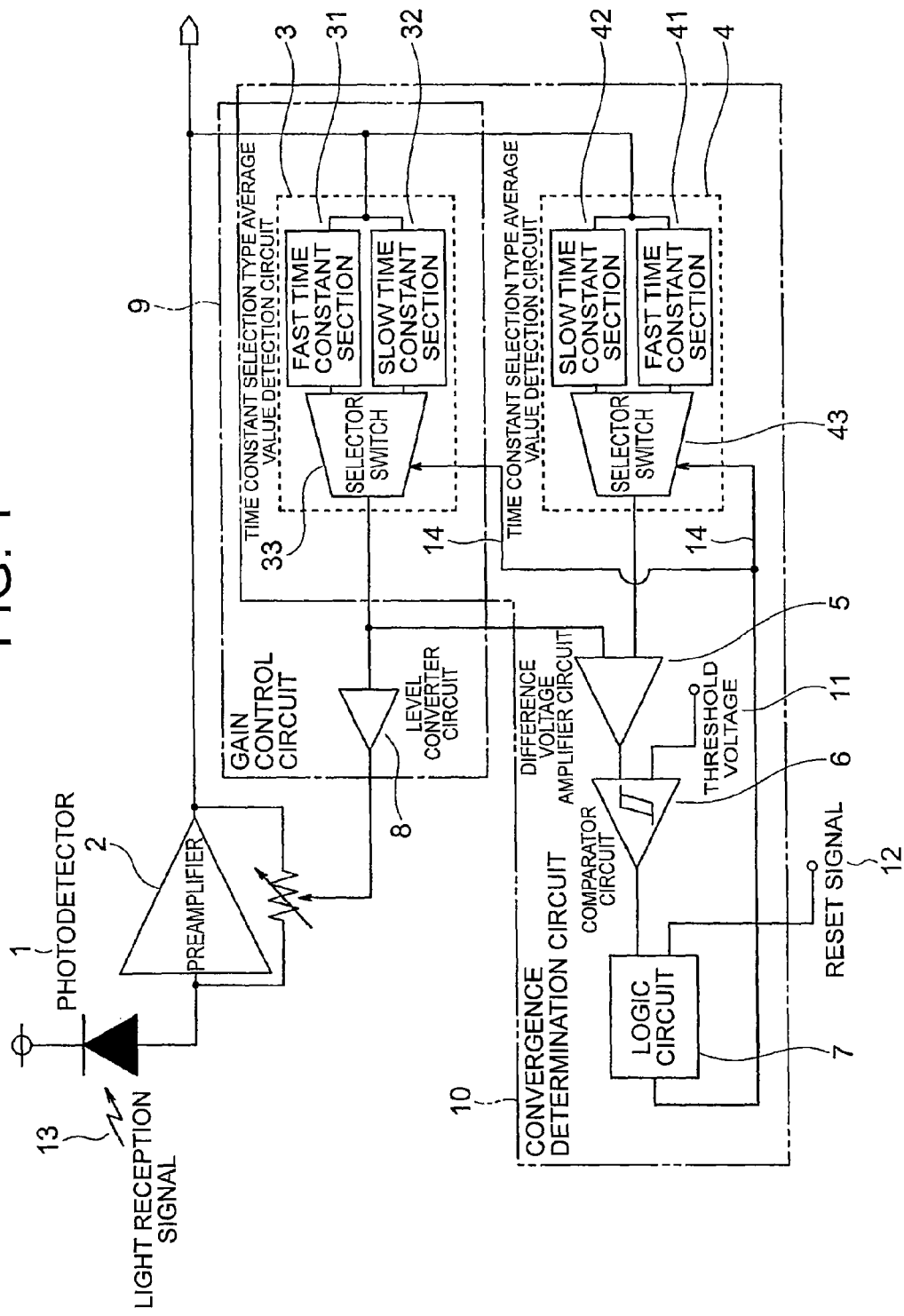
FIG. 1 A block diagram illustrating a configuration of an optical receiver according to a first embodiment of the present invention.

FIG. 1 is a diagram illustrating a configuration of an optical receiver according to a first embodiment of the present invention. The optical receiver exemplified in the first embodiment is a burst signal compatible optical receiver to be applied in a PON system. Referring to FIG. 1, reference numeral 1 represents a photodetector for converting a received light reception signal 13 (burst signal sequence) into a current signal. The light reception signal 13 is a burst signal sequence made up of a plurality of consecutive burst signals. Reference numeral 2 represents a preamplifier for converting the current signal into a voltage signal. Reference numeral 9 represents a gain control circuit for performing gain control (AGC) of the preamplifier 2. The gain control circuit 9 detects an average voltage of the voltage signal from the preamplifier 2, and controls, based on the average voltage, a conversion gain of the preamplifier 2 to be a desired gain according to a reception level of the light reception signal 13. Reference numeral 10 represents a convergence determination circuit for controlling a time constant of the gain control circuit 9. The convergence determination circuit 10 detects whether the gain control circuit 9 is in a transient state or in a steady state, and outputs a time constant switching signal 14 for switching the time constant of the gain control circuit 9 based on a result of the detection or a reset signal 12.

Next, the operation of the optical receiver according to the first embodiment of the present invention is described.

When receiving the light reception signal 13, the photodetector 1 linearly converts the light reception signal 13 into a current signal. The current signal is converted by the preamplifier 2 into an optimum voltage signal under control of the gain control circuit 9. The gain control circuit 9 operates to respond with an optimum time constant based on the time constant switching signal from the convergence determination circuit 10.

The gain control circuit 9 includes a time constant selection type average value detection circuit 3 and a level converter circuit 8. The level converter circuit 8 converts an output of the time constant selection type average value detection circuit 3 into a desired voltage. The time constant selection type average value detection circuit 3 includes a fast time constant section 31, a slow time constant section 32, and a selector switch 33. The fast time constant section 31 has a short time constant (first time constant), and detects an average voltage of the voltage signal from the preamplifier 2 (first average voltage detection section). The slow time constant section 32 has a time constant longer than the first time constant (second time constant), and detects an average voltage of the voltage signal from the preamplifier 2 (second average voltage detection section). The selector switch 33 selects anyone of the fast time constant section 31 and the slow time constant section 32 in accordance with the time constant switching signal 14, and inputs the average voltage detected by the selected time constant section to the level converter circuit 8. When the fast time constant section 31 is selected by the selector switch 33, the time constant selection type average value detection circuit 3 responds at high speed. When the slow time constant section 32 is selected by the selector switch 33, on the other hand, the time constant selection type average value detection circuit 3 responds at low speed.

The convergence determination circuit 10 includes a time constant selection type average value detection circuit 4, a difference voltage amplifier circuit 5, a comparator circuit 6, a logic circuit 7, and the above-mentioned time constant selection type average value detection circuit 3. The time constant selection type average value detection circuit 3 commonly belongs to the gain control circuit 9 and the convergence determination circuit 10. The time constant selection type average value detection circuit 4 includes a fast time constant section 41, a slow time constant section 42, and a selector switch 43. The fast time constant section 41 has a time constant longer than the first time constant and shorter than the second time constant (third time constant), and detects an average voltage of the voltage signal from the preamplifier 2 (third average voltage detection section). The slow time constant section 42 has a time constant equal to the second time constant (fourth time constant), and detects an average voltage of the voltage signal from the preamplifier 2 (fourth average voltage detection section). The selector switch 43 selects any one of the fast time constant section 41 and the slow time constant section 42, and inputs the average voltage detected by the selected time constant section to the difference voltage amplifier circuit 5. When the fast time constant section 41 is selected by the selector switch 43, the time constant selection type average value detection circuit 4 responds at high speed. When the slow time constant section 42 is selected by the selector switch 43, the time constant selection type average value detection circuit 4 responds at low speed. The difference voltage amplifier circuit 5 is a circuit for detecting a difference voltage between the output of the time constant selection type average value detection circuit 3 and the output of the time constant selection type average value detection circuit 4, and amplifies and outputs the detected difference voltage. The comparator circuit 6 compares the output level of the difference voltage amplifier circuit 5 with a predetermined threshold voltage 11 set in advance. The logic circuit 7 generates a time constant switching signal based on at least one of the output signal from the comparator circuit 6 and the reset signal 12 input from the outside, and inputs the time constant switching signal to the selector switches 33 and 43.

The first time constant of the fast time constant section 31 and the second time constant of the slow time constant section 32 in the time constant selection type average value detection circuit 3 and the third time constant of the fast time constant section 41 and the fourth time constant of the slow time constant section 42 in the time constant selection type average value detection circuit 4 have the following relationship.

first time constant<third time constant<second time constant=fourth time constant Specifically, the first time constant of the fast time constant section 31 is the shortest. The third time constant of the fast time constant section 41 is longer than the first time constant of the fast time constant section 31. The second and fourth time constants of the slow time constant sections 32 and 42 are longer than the third time constant of the fast time constant section 41. The second time constant of the slow time constant section 32 is equal to the fourth time constant of the slow time constant section 42.

Figure 2:
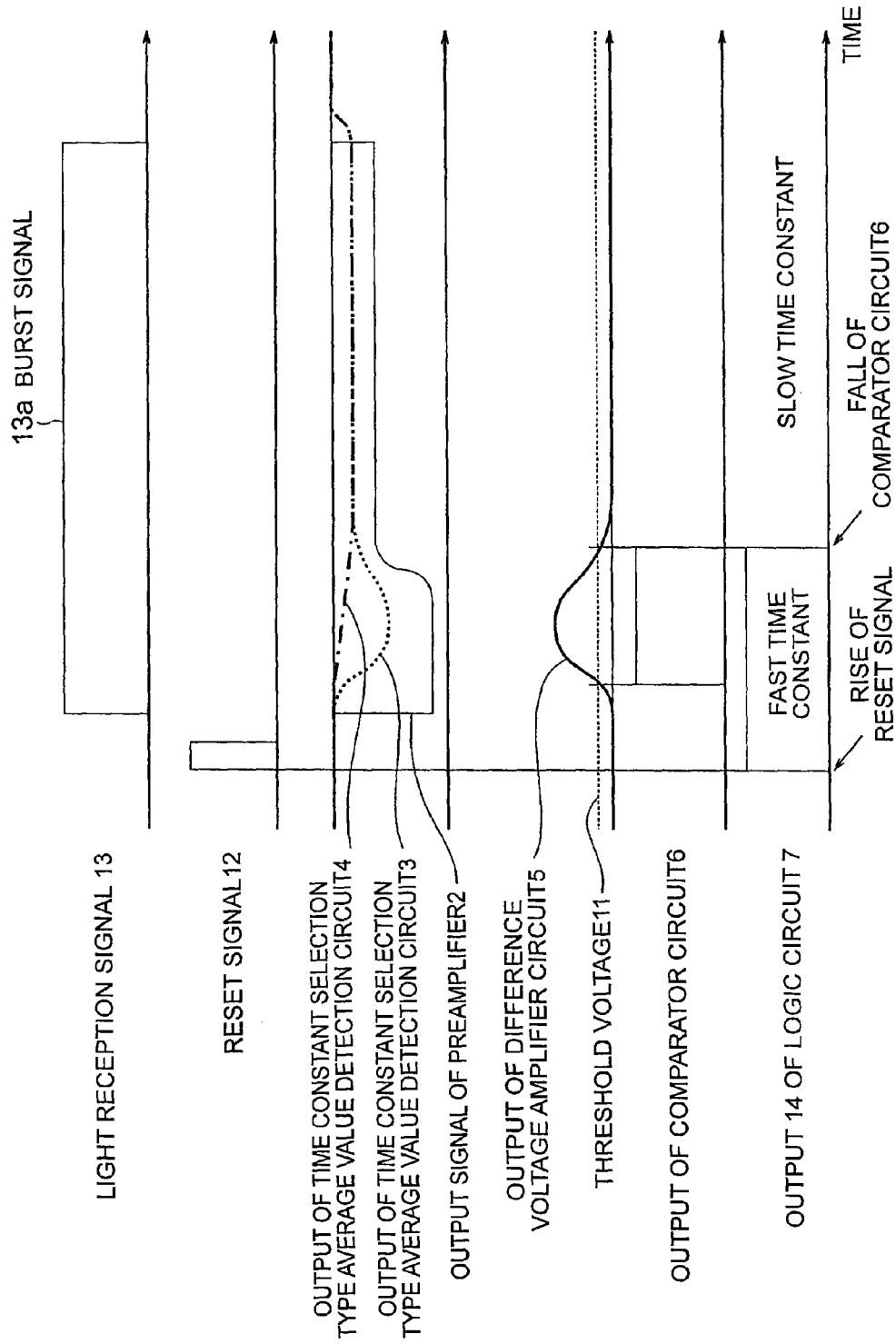
FIG. 2 A timing chart illustrating signal waveforms of respective sections of the optical receiver according to the first embodiment of the present invention.

Next, the operation of the respective sections of FIG. 1 is described with reference to FIG. 2. FIG. 2 is a timing chart illustrating the signal waveforms of the respective sections of FIG. 1.

As illustrated in FIG. 2, the light reception signal 13 consists of a consecutive burst signal sequence. Note that, only one burst signal 13a is illustrated in FIG. 2. Each burst signal 13a is transmitted by time division multiplex so as not to collide with another burst signal 13a, and is received by the photodetector 1. The reset signal 12, which is generated from a PON MAC or the like responsible for timing control, is inserted between the burst signals 13a. Triggered by the rise of the reset signal 12, the logic circuit 7 outputs the time constant switching signal 14 so that the time constants of the time constant selection type average value detection circuit 3 and the time constant selection type average value detection circuit 4 are fast. Based on the time constant switching signal 14, the selector switches 33 and 43 select the fast time constant sections 31 and 41, respectively. In FIG. 2, the output signal of the logic circuit 7 represents the fast time constant on the High side and the slow time constant on the Low side. In this way, the convergence determination circuit 10 determines in response to the input of the reset signal 12 to the logic circuit 7 that the gain control circuit 9 is in the transient state, and then selects the fast time constants.

When the burst signal 13a is received after the reception of the reset signal 12, the time constants of the time constant selection type average value detection circuit 3 and the time constant selection type average value detection circuit 4 are already set to the fast ones, and hence the gain is controlled at high speed to be an optimum gain with respect to the reception level of the received burst signal 13a. At this time, the third time constant of the fast time constant section 41 in the time constant selection type average value detection circuit 4 is set to be slower than the first time constant of the fast time constant section 31 in the time constant selection type average value detection circuit 3. Accordingly, the output of the fast time constant section 41 in the time constant selection type average value detection circuit 4 responds later than the output of the fast time constant section 31 in the time constant selection type average value detection circuit 3. Consequently, a potential difference occurs between the output of the time constant selection type average value detection circuit 3 and the output of the time constant selection type average value detection circuit 4. The potential difference is detected by the difference voltage amplifier circuit 5, and is amplified to a desired potential difference and then output. The output from the difference voltage amplifier circuit 5 is input to the comparator circuit 6. The comparator circuit 6 compares the output from the difference voltage amplifier circuit 5 with the threshold voltage 11 set in advance. The comparator circuit 6 outputs a High signal at a timing at which the comparison shows that the output from the difference voltage amplifier circuit 5 becomes the threshold voltage 11 or higher.

After that, the conversion gain of the preamplifier 2 is controlled by the gain control circuit 9, and the output of the time constant selection type average value detection circuit 4, which is slower than the output of the time constant selection type average value detection circuit 3, also follows the output signal of the preamplifier 2 as approaching the steady state from the transient state, and hence the potential difference between the output of the time constant selection type average value detection circuit 3 and the output of the time constant selection type average value detection circuit 4 is reduced. In this way, the comparator circuit 6 outputs a Low signal at a timing at which the output from the difference voltage amplifier circuit 5 becomes below the threshold voltage 11. In other words, the comparator circuit 6 operates to output a High signal in the state where the gain control operation for the received burst signal is incomplete (in the transient state) and output a Low signal in the state where the gain control operation for the received burst signal is completed (in the steady state).

Triggered by the fall of the output signal of the comparator circuit 6, the logic circuit 7 outputs the time constant switching signal 14 so that the time constants of the time constant selection type average value detection circuit 3 and the time constant selection type average value detection circuit 4 are slow. Based on the time constant switching signal 14, the selector switches 33 and 43 select the slow time constant sections 32 and 42, respectively. In this way, the convergence determination circuit 10 determines at the timing at which the output from the difference voltage amplifier circuit 5 becomes below the threshold voltage 11 that the gain control circuit 9 has shifted from the transient state to the steady state, and then selects the slow time constants.

After that, the time constants of the time constant selection type average value detection circuit 3 and the time constant selection type average value detection circuit 4 remain to be the slower ones until the tail of one burst signal 13a. Then, when the reset signal 12 inserted between burst signals is received, the time constant switching signal 14 for selecting the fast time constants is output again so as to switch the time constants of the time constant selection type average value detection circuit 3 and the time constant selection type average value detection circuit 4 to the faster ones, thereby preparing for the next burst signal 13a.

In this case, the second time constant (slower) of the slow time constant section 32 in the time constant selection type average value detection circuit 3 and the fourth time constant (slower) of the slow time constant section 42 in the time constant selection type average value detection circuit 4 are set to be equal to each other, and hence no delay occurs therebetween. Therefore, even as for a signal having consecutive identical digits, no potential difference occurs between the output of the time constant selection type average value detection circuit 3 and the output of the time constant selection type average value detection circuit 4, and no erroneous shift to the faster side again occurs. Therefore, when the slow time constant section 32 and the slow time constant section 42 are selected, it is unnecessary to calculate the potential difference by the difference voltage amplifier circuit 5, and hence the potential difference is not always required to be calculated.

In this way, in this embodiment, the received burst signal is subjected to the gain control at high speed for the vicinity of the head of the burst signal, thereby realizing high-speed response, and further, the optical receiver shifts to the slow response state after the completion of the gain control, thereby realizing consecutive identical digit tolerance at the same time.

As described above, the optical receiver according to the first embodiment of the present invention includes the preamplifier 2 capable of changing the conversion gain in accordance with the reception level of the received burst signal, the gain control circuit 9 capable of switching the time constant to the faster or slower one, and the convergence determination circuit 10 for outputting the time constant switching signal 14 in accordance with the state of the gain control circuit 9 (transient state or steady state) and the reset signal between burst signals, and hence the time constant of the gain control circuit 9 can be switched at an appropriate timing. Consequently, the optical receiver according to the first embodiment has wide dynamic range characteristics for reproducing burst signals having different reception levels stably. The optical receiver according to the first embodiment also has high-speed response and consecutive identical digit tolerance. Besides, the optical receiver according to the first embodiment is excellent in throughput characteristics.

Second Embodiment

Figure 3:
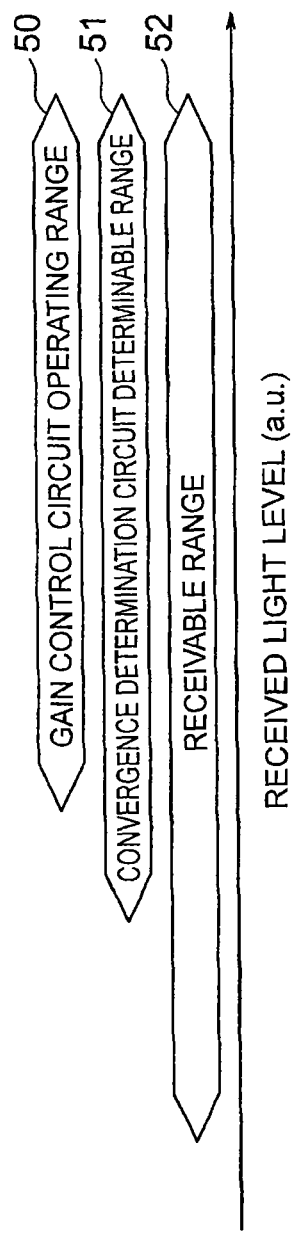
FIG. 3 An explanatory diagram showing a receivable range, an operating range of a gain control circuit, and a determinable range of a convergence determination circuit with respect to a reception level in an optical receiver according to a second embodiment of the present invention.

FIG. 3 is a diagram showing a range 50 where the gain control circuit 9 operates and a range 51 where the convergence determination circuit 10 can make a determination with respect to the reception level in an optical receiver according to a second embodiment of the present invention. In the second embodiment, as shown in FIG. 3, the value of the threshold voltage 11 is appropriately set so that the range 50 of the gain control circuit 9 becomes within the range 51 of the convergence determination circuit 10. Note that, the threshold voltage 11 is input to the comparator circuit 6 as illustrated in FIG. 1. In this way, the convergence determination circuit 10 can always make a determination as long as the reception level is at such a level that the gain control circuit 9 operates.

The configuration and operation of the optical receiver according to the second embodiment are the same as those in the above-mentioned first embodiment, and hence descriptions thereof are herein omitted by referring to FIGS. 1 and 2. The difference from the first embodiment is mainly described below.

In an optical receiver for realizing a wide dynamic range by gain control, it is common practice not to perform gain control in the vicinity of the minimum receiving sensitivity in order to achieve the high sensitivity. Specifically, the optical receiver operates with a maximum gain in the vicinity of the minimum receiving sensitivity, and, when the reception level is high, operates to decrease the gain in order to suppress waveform distortion or avoid circuit saturation.

First, a description is given of the case where the output maximum amplitude of the difference voltage amplifier circuit 5 of FIG. 1 is lower than the threshold voltage 11. In this case, the output voltage of the comparator circuit 6 continues to keep Low from the head to the tail of one burst signal. Consequently, the time constant selection type average value detection circuit 3 always operates in the high speed state.

In the reception level range where the gain control circuit 9 does not operate (the range out of the range 50), even if the time constant selection type average value detection circuit 3 continues to operate at high speed as described above, no gain control is performed and hence there is no problem even if the identical digits are consecutive.

In the range 50 where the gain control circuit 9 operates, on the other hand, if the time constant selection type average value detection circuit 3 continues to operate at high speed as described above, the output of the time constant selection type average value detection circuit 3 follows the output signal of the preamplifier 2 at high speed in the case where the identical digits are consecutive. Thus, large gain fluctuations occur to make it difficult to reproduce the burst signal stably.

To deal with this problem, in the second embodiment, the threshold voltage to be input to the comparator circuit 6 is appropriately set so that the convergence determination circuit 10 can reliably make a determination in the range 50 where the gain control circuit 9 operates. Specifically, in the range 50 where the gain control circuit operates, the threshold voltage 11 of the comparator circuit 6 is set to be a value smaller than a difference voltage between the time constant selection type average value detection circuit 3 and the time constant selection type average value detection circuit 4. Note that, the value of the threshold voltage 11 may be set in advance based on a design value in the design phase, or may be appropriately changed based on the output from the difference voltage amplifier circuit 5.

As described above, in the burst optical receiver according to the second embodiment of the present invention, the same effects as in the above-mentioned first embodiment can be obtained. In addition, in the second embodiment, the threshold voltage 11 is set to be an appropriate value so that the convergence determination circuit 10 can reliably make a determination in the range 50 where the gain control circuit 9 operates. Consequently, the burst optical receiver according to the second embodiment has broad dynamic range characteristics for reproducing burst signals having different reception levels stably, and has both high-speed response and consecutive identical digit tolerance. Thus, the burst optical receiver having excellent throughput characteristics can be realized.

REFERENCE SIGNS LIST

1 photodetector, 2 preamplifier, 3, 4 time constant selection type average value detection circuit, 5 difference voltage amplifier circuit, 6 comparator circuit, 7 logic circuit, 8 level converter circuit, 9 gain control circuit, 10 convergence determination circuit, 11 threshold voltage, 12 reset signal, 31 fast time constant section, 32 slow time constant section, 33 selector switch, 41 fast time constant section, 42 slow time constant section, 43 selector switch.

The invention claimed is:

1. An optical receiver, comprising:
   a photodetector for converting a light reception signal into a current signal;
   a preamplifier for converting the current signal output from the photodetector into a voltage signal;
   gain control means for detecting an average voltage of the voltage signal output from the preamplifier by a first average voltage detection section that has a first time constant or a second average voltage detection section that has a second time constant longer than the first time constant, and controlling, with use of the detected average voltage, a conversion gain of the preamplifier to be a desired gain according to a reception level of the light reception signal; and
   convergence determination means for determining whether the gain control means is in a transient state or in a steady state, and generating a time constant switching signal for selecting the first average voltage detection section of the gain control means when it is determined that the gain control means is in the transient state and selecting the second average voltage detection section of the gain control means when it is determined that the gain control means is in the steady state,
   wherein the convergence determination means comprises:
      a third average voltage detection section that has a third time constant longer than the first time constant of the first average voltage detection section and shorter than the second time constant of the second average voltage detection section, for detecting an average voltage of the voltage signal output from the preamplifier;
      a difference voltage detection section for calculating a difference voltage between the average voltage detected by the first average voltage detection section and the average voltage detected by the third average voltage detection section when the first average voltage detection section is selected; and
      a comparator section for comparing the difference voltage with a predetermined threshold voltage and determining whether the gain control means is in the transient state or in the steady state based on a result of the comparison.

2. The optical receiver according to claim 1, wherein, when the second average voltage detection section is selected, the convergence determination means determines that the gain control means is in the steady state.

3. The optical receiver according to claim 1,
   wherein the convergence determination means comprises a fourth average voltage detection section that has a fourth time constant equal to the second time constant of the second average voltage detection section, for detecting an average voltage of the voltage signal output from the preamplifier, and
   wherein the difference voltage detection section calculates a difference voltage between the average voltage detected by the second average voltage detection section and the average voltage detected by the fourth average voltage detection section when the second average voltage detection section is selected.

4. The optical receiver according to claim 3, wherein, when a reset signal inserted between the light reception signals is received, the convergence determination means determines that the gain control means is in the transient state, irrespective of processing of the difference voltage detection section and the comparator section.

5. The optical receiver according to claim 1, wherein, when a reset signal inserted between the light reception signals is received, the convergence determination means determines that the gain control means is in the transient state, irrespective of processing of the difference voltage detection section and the comparator section.

6. The optical receiver according to claim 1, wherein the predetermined threshold voltage of the comparator section is a value smaller than the difference voltage between the first average voltage detection section and the third average voltage detection section in a reception level range where the gain control means operates.

* * * * *